US008652963B2

(12) United States Patent
Yang et al.

(10) Patent No.: US 8,652,963 B2
(45) Date of Patent: Feb. 18, 2014

(54) MOSFET INTEGRATED CIRCUIT WITH UNIFORMLY THIN SILICIDE LAYER AND METHODS FOR ITS MANUFACTURE

(75) Inventors: Bin Yang, San Carlos, CA (US); Christian Lavoie, Pleasantville, NY (US); Emre Alptekin, Wappingers Falls, NY (US); Ahmet S. Ozcan, Pleasantville, NY (US); Cung D. Tran, Newburgh, NY (US); Mark Raymond, Schenectady, NY (US)

(73) Assignees: GLOBALFOUNDRIES, Inc., Grand Cayman (KY); International Business Machines Corporation, Armonk, NY (US)

( * ) Notice: Subject to any disclaimer, the term of this patent is extended or adjusted under 35 U.S.C. 154(b) by 48 days.

(21) Appl. No.: 13/237,732

(22) Filed: Sep. 20, 2011

(65) Prior Publication Data
US 2013/0069124 A1 Mar. 21, 2013

(51) Int. Cl.
*H01L 21/44* (2006.01)
(52) U.S. Cl.
USPC .................................. 438/655; 257/E21.129

(58) Field of Classification Search
USPC ......... 438/672, 197, 583, 630, 651, 682, 581, 438/655; 257/408, E29, 288, 754, E21.129
See application file for complete search history.

(56) References Cited

U.S. PATENT DOCUMENTS

| 6,204,137 | B1 * | 3/2001 | Teo et al. ...................... 438/305 |
| 2003/0209765 | A1 * | 11/2003 | Lee et al. ...................... 257/382 |
| 2006/0189053 | A1 * | 8/2006 | Wang et al. ................... 438/197 |
| 2007/0290277 | A1 * | 12/2007 | Chang et al. .................. 257/408 |
| 2008/0054363 | A1 * | 3/2008 | Jeon ............................... 257/369 |
| 2010/0078690 | A1 * | 4/2010 | Sugiyama et al. ............ 257/288 |
| 2010/0081249 | A1 * | 4/2010 | Tien et al. ..................... 438/424 |
| 2010/0285656 | A1 * | 11/2010 | Esconjauregui et al. ..... 438/478 |
| 2011/0117738 | A1 * | 5/2011 | Russell et al. ................ 438/664 |

* cited by examiner

*Primary Examiner* — Lex Malsawma
(74) *Attorney, Agent, or Firm* — Ingrassia Fisher & Lorenz, P.C.

(57) ABSTRACT

An MOSFET device having a Silicide layer of uniform thickness, and methods for its fabrication, are provided. One such method involves depositing a metal layer over wide and narrow contact trenches on the surface of a silicon semiconductor substrate. Upon formation of a uniformly thin amorphous intermixed alloy layer at the metal/silicon interface, the excess (unreacted) metal is removed. The device is annealed to facilitate the formation of a thin silicide layer on the substrate surface which exhibits uniform thickness at the bottoms of both wide and narrow contact trenches.

19 Claims, 6 Drawing Sheets

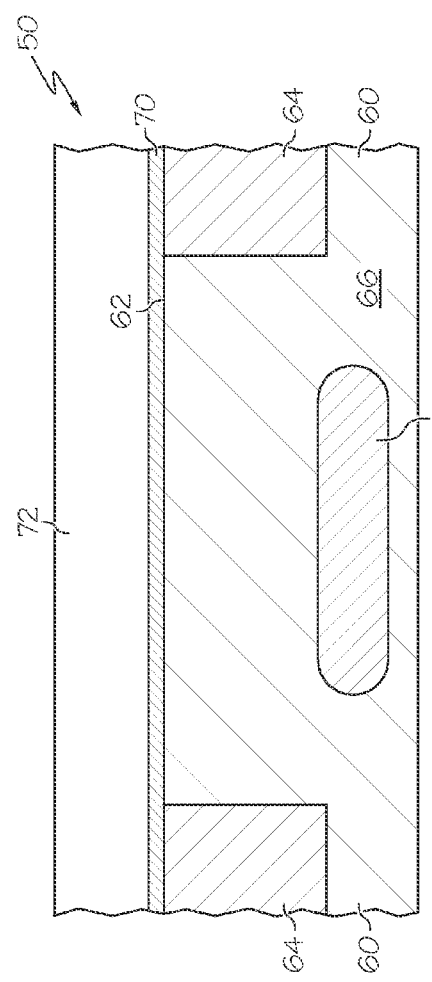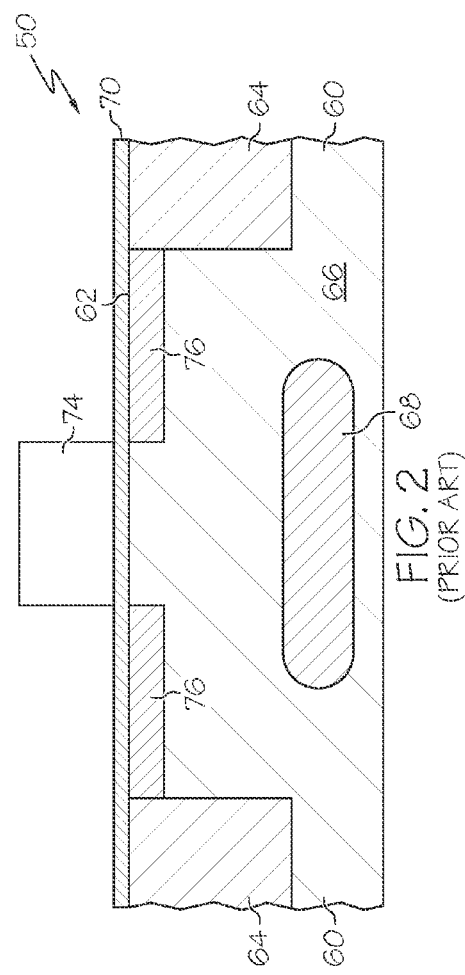

MOSFET INTEGRATED CIRCUIT WITH UNIFORMLY THIN SILICIDE LAYER AND METHODS FOR ITS MANUFACTURE

TECHNICAL FIELD

The present invention generally relates to MOSFET semiconductor devices and methods for their fabrication, and more particularly to improved methods for fabricating MOSFET devices with improved Silicide thickness uniformity.

BACKGROUND

The transistor is the basic building block of all present day integrated circuit (IC) designs and devices. Fundamentally, a transistor is an electronic switch which includes a source region, a drain region electrically insulated from the source, and a control gate. A control voltage applied to the gate electrode selectively controls electrical communication between the source and drain electrodes, thereby controlling the binary ("on" and "off") state of the device.

A common integrated circuit implementation involves interconnecting a large number of field effect transistors (FETs), typically metal oxide semiconductor field effect transistors (MOSFETs), resulting in a highly complex, three dimensional integrated circuit device. The mechanical and electrical integrity of the source, drain, and gate electrodes of these transistors can significantly impact device performance, device variation, and manufacturing yield.

As the number and complexity of functions implemented in IC devices (such as microprocessors and memory devices) increases, more and more transistors must be incorporated into the underlying integrated circuit chip. The fabrication of large scale integrated circuit devices presents a number of competing manufacturing and processing challenges.

Presently known methods of fabricating electrical contacts for drain, source, and gate electrodes involve the use of a "Silicide" layer (also called a "metal Silicide" layer). More particularly, a thin layer of metal (such as Nickel, Erbium, Cobalt, Titanium, Platinum, Ytterbium, and their alloys) is deposited onto the substrate surface, for example by physical vapor deposition (PVD), chemical vapor deposition (CVD), or plasma enhanced chemical vapor deposition (PECVD). A thermal annealing process, such as rapid thermal annealing (RTA), facilitates reaction of the metal and substrate, resulting in formation of a metal Silicide layer (e.g. nickel Silicide).

It is desired to produce a metal Silicide layer having a uniform thickness across the surface of the wafer, and particularly in contact trenches of different dimensions (i.e., on the bottom surfaces of both wide and narrow canyons). However, current methods in manufacturing by physical vapor deposition (PVD) do not reliably form a uniformly thin metal Silicide layer, especially in the presence of high aspect ratio structures. Rather, conventional methods tend to produce metal silicide layers with a greater thickness at the bottom of wide trenches, and a correspondingly lesser thickness at the bottom of narrower trenches. This can lead to device variation and may ultimately adversely affect manufacturing yield.

Accordingly, a need exists to provide methods for fabricating MOSFET ICs having a metal silicide layer which is of uniform thickness across the device surface, and particularly in contact trenches having different dimensions.

Furthermore, other desirable features and characteristics of various embodiments will become apparent from the subsequent summary, detailed description, and the appended claims, taken in conjunction with the accompanying drawings, brief description of the drawings, the foregoing technical field and this background of the invention.

BRIEF SUMMARY

In accordance with one embodiment, a method for fabricating a MOSFET IC having a metal silicide layer of substantially uniform thickness at the bottoms of both wide and narrow contact trenches includes depositing a layer of metal over the substrate and forming an amorphous alloy layer of silicon intermixed with metal at the silicon/metal interface in the range of about 1-5 nanometers. The unreacted metal is then removed from the substrate surface, and the substrate is exposed a thermal process to convert the amorphous alloy layer into silicide with a thickness of about 2-10 nanometers. The thermal treatment can be done by furnace annealing, rapid thermal annealing (RTA), or Laser annealing (LSA). The RTA condition can be in the range of about 200-500 C for about 30 seconds.

In accordance with one embodiment the unreacted metal is removed from the substrate surface using a wet etch process which selectively etches the deposited metal layer but does not substantially etch the amorphous alloy layer.

BRIEF DESCRIPTION OF THE DRAWINGS

The present invention will hereinafter be described in conjunction with the following drawing figures, wherein like numerals denote like elements, and:

FIGS. 1-4 illustrate, in cross sectional views, portions of various prior art MOSFET integrated circuit devices and fabrication methods;

DETAILED DESCRIPTION

Figure 3:
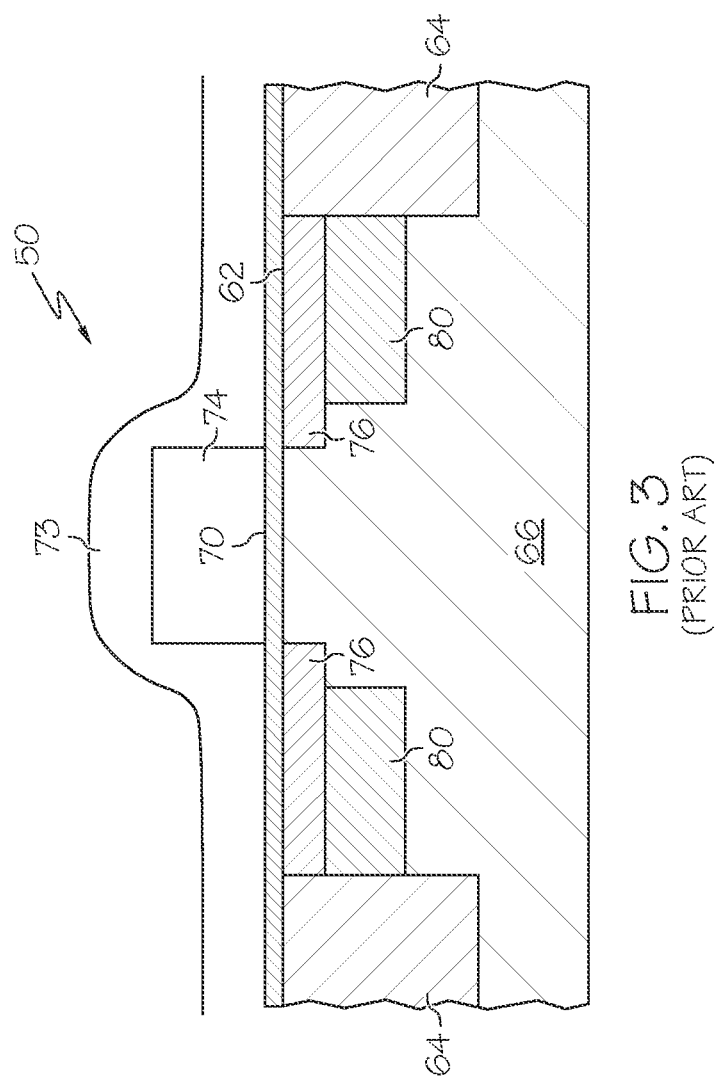

The following detailed description is merely exemplary in nature and is not intended to limit the invention or the application and uses of the invention. Furthermore, the invention is not bound by any theory presented in the preceding background or the following detailed description.

Methods are provided for forming a Silicide layer of uniform thickness across the surface of a wafer containing MOSFET integrated circuit (IC) devices. One such method involves depositing a metal layer over the active and open areas of a semiconductor substrate to a thickness in the range of approximately 1-30 nanometers, and preferably about 10 nm. The metal may be deposited by physical vapor deposition (PVD), chemical vapor deposition (CVD), plasma enhanced chemical vapor deposition (PECVD), or other suitable techniques. Some of the deposited metal reacts with the silicon substrate, forming a thin amorphous alloy layer at the interface between the silicon substrate and the deposited metal layer during the deposition process. Depending on the particular metal or metals deposited and the composition of the silicon substrate, the resulting amorphous alloy layer exhibits a thickness in the range of 1-10 nanometers, for example about 1-5 nm.

Having formed an amorphous alloy layer of desired uniform thickness at the metal/silicon boundary, the "pure" (unreacted) metal is removed, for example using any conventional wet selective etch process. The remaining amorphous alloy is then transferred into the substrate surface through a thermal annealing process. In one embodiment, thermal migration is carried out using RTA with a thermal budget of 200-500 C for 30 seconds. This results in a uniformly thin metal silicide layer at the silicon substrate surface with a thickness of about twice the thickness of the amorphous alloy layer prior to thermal migration. Thus, an amorphous alloy layer in the range of 1-5 nm yields a metal silicide layer of about 2-10 nm upon rapid thermal annealing.

FIGS. 1-4 generally illustrate a portion of a MOSFET integrated circuit device 50 and various methods for its fabrication. The portion of IC device 50 illustrated in FIGS. 1-4 is a single MOSFET transistor. In accordance with the various embodiments to be described, the single transistor can be either an n-channel MOS transistor or a p-channel transistor. The complete IC can include n-channel transistors, p-channel transistors, or can be a CMOS IC including both types. The described embodiments can be applied to any number of transistors in the IC.

Although the terms "MOS" and "MOSFET" device properly refer to a device having a metal gate electrode and an oxide gate insulator, as used herein these terms refer to any semiconductor device that includes a conductive gate electrode (whether metal or other conductive material) that is positioned over a gate insulator (whether oxide or other insulator) which, in turn, is positioned over a semiconductor substrate.

In addition, various steps in the manufacture of MOSFET transistors are well known and, consequently, in the interest of brevity many conventional steps are mentioned only briefly herein or omitted entirely without providing the well known process details.

The method for fabricating IC device 50 in accordance with one embodiment begins, as illustrated in FIG. 1, by providing a semiconductor substrate 60 having a surface 62. The semiconductor substrate can be silicon (Si), silicon admixed with germanium (SiGe), carbon, or other semiconductor material used in the semiconductor industry. Isolation regions 64 such as shallow trench isolation (STI) are formed in the semiconductor substrate, extend into the substrate from the surface, and serve to aid in defining a well region 66. Isolation regions 64 provide electrical isolation between a device (or devices) formed in well region 66, and devices formed in adjacent well regions. Although not used in all ICs, a buried layer 68 may be formed underlying the well region. For an n-channel MOS transistor the well region is impurity doped p-type.

In accordance with one embodiment the method of fabricating a semiconductor device continues by forming a thin insulating layer 70 on surface 62. A layer 72 of metal, silicon or dummy gate material such as polycrystalline silicon is deposited over the thin insulating layer.

As illustrated in FIG. 2, the method continues by patterning layer 72 to form a gate or other structure 74. Structure 74 can be formed by conventional photolithographic patterning and anisotropic etching, for example by reactive ion etching (RIE). In accordance with one embodiment source and drain extensions 76 are formed by ion implanting n-type conductivity determining ions such as arsenic ions into the surface of the well region using structure 74 as an ion implantation mask. The source and drain extensions are thus self aligned to structure 74.

Figure 4:
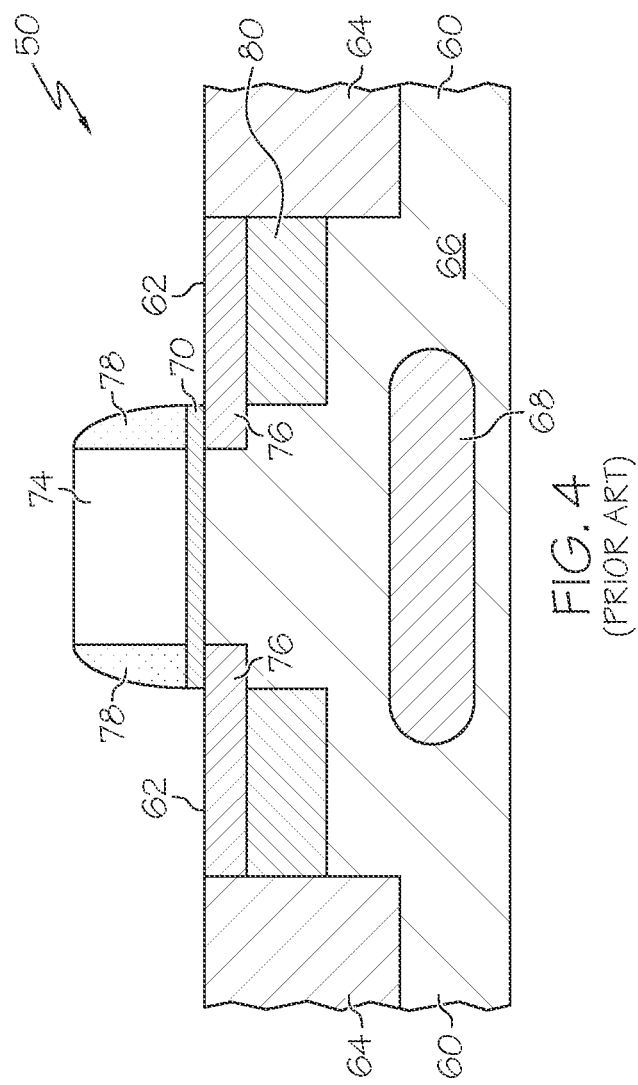

As illustrated in FIGS. 3 and 4, sidewall spacers 78 may be formed on the edges of structure 74. The sidewall spacers can be formed, for example, by depositing a layer 73 of dielectric material such as an oxide or a nitride overlying structure 74 and insulating layer 70 (see FIG. 3). The dielectric material is anisotropically etched with the anisotropic etching continuing to etch the exposed portion of thin insulating layer 70, to produce sidewall spacers 78 (see FIG. 4).

Referring to FIG. 4, deep source and drain regions 80 may be formed by ion implanting n-type conductivity determining ions such as arsenic or phosphorous ions into the surface of well region 66 using structure 74 and sidewall spacers 78 as an ion implantation mask. The deep source and drain regions are thus self aligned to the sidewall spacers and also self aligned to and spaced apart from structure 74. The device structure is thermally annealed, for example by a rapid thermal annealing (RTA), to activate the implanted ions.

Referring now to FIGS. 3-4, structure 74 suitably comprises a gate electrode 94, and layer 70 suitably comprises a gate insulator 92. Gate insulator 92 can be, for example, a layer of thermally grown silicon dioxide, perhaps admixed with nitrogen, overlaid by a layer of a hafnium oxide or other high k dielectric material. The composite gate insulator is a high k insulator as it has a dielectric greater than the dielectric constant of silicon dioxide alone. The gate electrode material can be, for example, a layer of metal overlaid by a layer of polycrystalline silicon. The layer of metal can be selected, as well known by those of skill in the art, to effect a proper threshold voltage for the MOSFET device being fabricated.

In accordance with a preferred embodiment, device 50 is further processed by middle of line (MOL) and back end of line (BEOL) processing steps. For example and referring now to FIG. 5, contact openings (also referred to as canyons or trenches) 501 and 503 may be etched through a layer of gap fill material (not shown) to expose surfaces of the source and drain regions. A metal silicide layer 77 is laid down which extends through the contact openings to these exposed surfaces, forming the device's conductive interconnects as explained more fully below.

Figure 5:
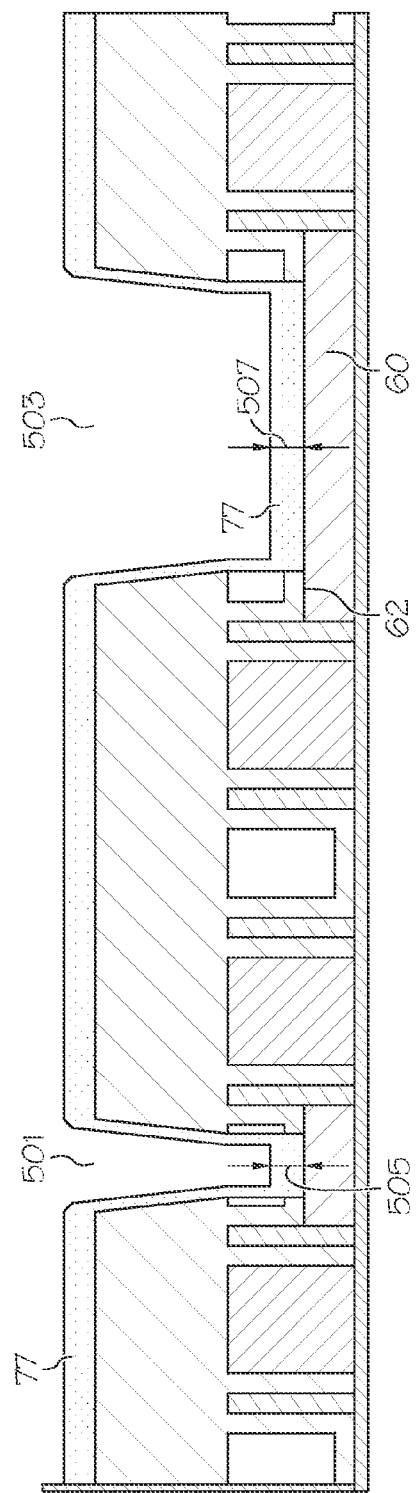
FIG. 5 illustrates, in cross section, the formation of a metal Silicide layer on a semiconductor substrate.

More particularly and with continued reference to FIG. 5, a metal Silicide layer 77 is formed on surface 62 of substrate 60, including the active areas of the device. In this regard, those skilled in the art will appreciate that an active area of a device generally corresponds to an area of densely patterned features such as gates, electrodes, or other microelectronic structures. Areas between structures may be characterized by narrower trenches 501, or relatively wider trenches 503, depending on device geometry. Fabrication of silicide layer 77 involves depositing a thin layer of metal on the surface of substrate 60, for example by physical vapor deposition (PVD), chemical vapor deposition (CVD), or plasma enhanced chemical vapor deposition (PECVD). The metal layer is typically deposited in the range of 2-30 nm, and preferably about 10 nm.

Presently known methods typically employ a two-step annealing process to facilitate migration of the deposited metal into the silicon substrate. A first rapid thermal annealing (RTA) stage, sometimes referred to as RTA1, exposes the substrate and the deposited metal layer to an elevated temperature range of about 330 C for approximately 30 seconds. During this stage the deposited metal atoms react with the underlying silicon substrate and migrate through the substrate surface into the underlying silicon matrix. The residual (unreacted) metal is removed through an etching process tailored to the particular metal used to form the metal silicide layer. A second stage annealing process (RTA2) ensures that a sufficient amount of metal reacts with the silicon to form a metal silicide layer of a desired thickness.

As illustrated in FIG. 5, conventional silicide processes tend to produce thinner metal silicide layers 505 at the bottom of narrow trenches, and comparatively thicker silicide layers 507 in wider trenches 503. This effect is known as "shadowing", wherein the geometries of the various microelectronic structures impede line-of-sight deposition of metal atoms at the bottom of trenches. This is particularly true for trenches near high aspect ratio (the ratio of a feature's height to its width) structures.

Variations in metal silicide layer thickness may lead to device variation, and can negatively impact device performance and, ultimately, manufacturing yield. More particularly, a silicide layer that is thicker than desired can produce high leakage currents at MOSFET junctions. On the other hand, thinner silicide layers tend to promote agglomeration of the metal in the silicide layer, especially at high thermal budgets. Metal silicide processes are thus needed which reliably form silicide layers of uniform thickness, particularly in contact trenches of different geometries.

Figure 6:
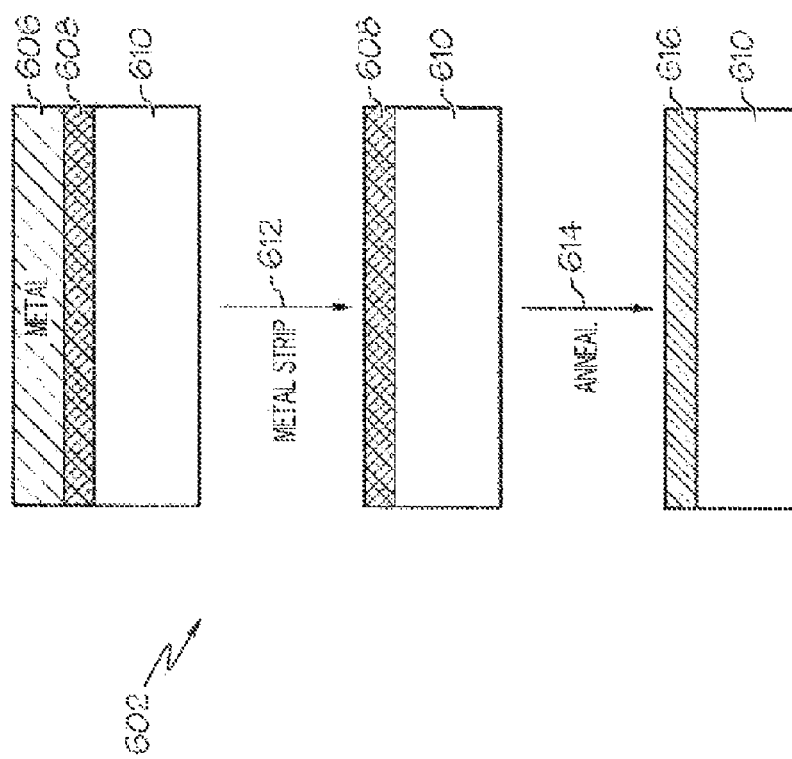
FIG. 6 is a process flow chart setting forth new and improved methods for depositing a uniformly thin metal Silicide layer on a semiconductor substrate.

FIG. 6 is a process flow diagram illustrating a new and improved process 602 for forming a uniformly thin silicide layer on a silicon substrate in accordance with a preferred embodiment.

More particularly and as discussed above, when a metal layer 606 in the range of 2-30 nm is deposited on the surface of a silicon substrate 610, a thin amorphous intermixed layer 608 forms at the interface between the deposited metal layer and the underlying silicon substrate. The formation of this metal/silicon boundary layer occurs without any further processing and appears to be self-limiting; that is, the metal reacts with the silicon substrate and consistently forms an intermixed (alloy) layer exhibiting a uniform thickness on the order of about 1 to 5 nanometers, for example about 2-5 nm. This phenomenon has been observed in at least the following species: Nickel; Titanium; Cobalt; Platinum; Ytterbium; Erbium; Gold; and their alloys.

In conventional silicide formation processes, the deposited metal layer typically undergoes rapid thermal annealing to facilitate thermal migration of the metal into the substrate. In contrast, recognizing that an amorphous intermixed metal/silicon layer exhibiting a uniform thickness has already formed, in a preferred embodiment the excess (unreacted) metal is removed ("stripped"), for example using a conventional wet etch process 612. More particularly, an etch is selected which selectively etches the deposited metal, but which does not etch the amorphous alloy layer.

After stripping off the excess metal the wafer undergoes an annealing process 614 to produce a textured metal silicide layer 616 in the range of about 2-10 nm on the surface of silicon substrate 610. In a preferred embodiment, the thermal budget for this RTA involves a temperature profile in the range of about 200-500 C for about 30 seconds. This annealing process causes the formation of the metal silicide layer.

Figure 7:
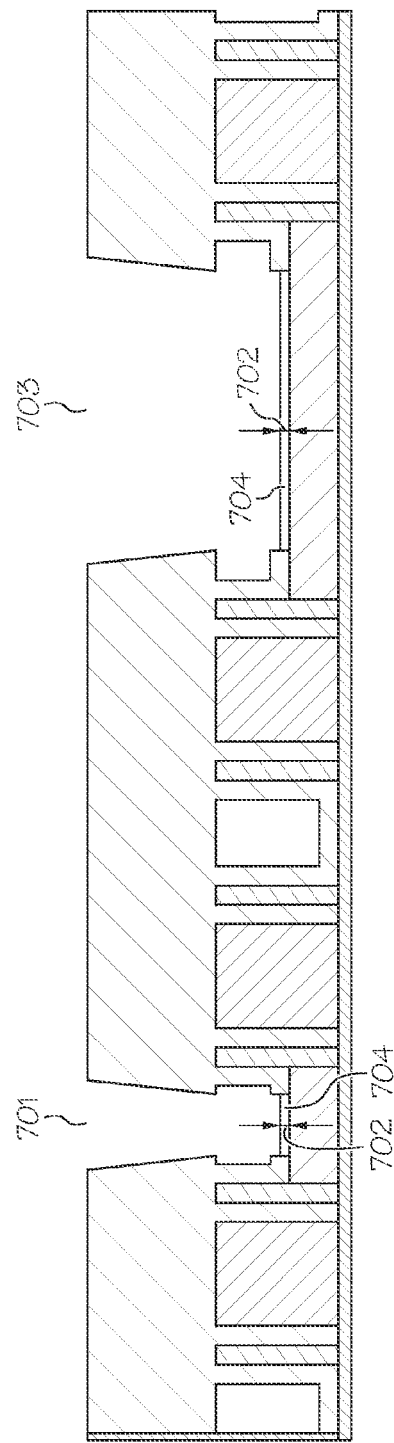
FIG. 7 illustrates, in cross section, a new and improved method for forming a metal silicide layer of uniform thickness in wide and narrow contact trenches.

Referring now to FIG. 7, in a preferred embodiment the resulting textured metal silicide layer 704 exhibits a uniform thickness 702 in the range of about 2-10 nm across the wafer, and particularly at the bottom of the narrow trenches 701 and wide trenches 703.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the invention in any way. Rather, the foregoing detailed description will provide those skilled in the art with a convenient road map for implementing the exemplary embodiments. Various changes can be made in the size, spacing and geometries of elements without departing from the scope of the invention as set forth in the appended claims and the legal equivalents thereof.

What is claimed is:

1. A method for fabricating an integrated circuit device on a silicon substrate having source and drain regions, comprising:
   depositing a gap fill layer over said source and drain regions;
   etching wide and narrow contact trenches through said gap fill layer to expose surfaces of said source and drain regions;
   depositing a layer of metal over said wide and said narrow contact trenches;
   forming an amorphous alloy layer comprising silicon intermixed with said metal at the interface of said metal layer and said silicon substrate, said amorphous alloy layer having a substantially uniform thickness in said wide and said narrow contact trenches;
   removing unreacted metal from said substrate surface prior to annealing; and
   thereafter annealing said substrate at a predetermined elevated temperature range for a predetermined period of time to convert at least a portion of said amorphous alloy layer into a thin silicide layer.

2. The method of claim 1 wherein removing unreacted metal comprises exposing said substrate to an etchant which selectively etches said deposited metal layer and which does not substantially etch said amorphous alloy layer.

3. The method of claim 2 wherein said etchant is a wet etch process.

4. The method of claim 2 wherein depositing said metal layer comprises depositing nickel by physical vapor deposition.

5. The method of claim 2 wherein said silicon substrate comprises at least one of: silicon; silicon admixed with germanium; and silicon admixed with carbon.

6. The method of claim 1 wherein depositing a layer of metal comprises depositing at least one of Nickel, Titanium, Cobalt, Platinum, Ytterbium, and Erbium.

7. The method of claim 1 further comprising:
   patterning microelectronic structures in the vicinity of said narrow and said wide contact trenches prior to depositing said metal layer; and
   wherein depositing said metal layer comprises depositing said metal layer over said microelectronic structures.

8. The method of claim 7, wherein depositing said metal layer comprises depositing said metal layer over a gate electrode.

9. The method of claim 7 wherein patterning microelectronic structures comprises patterning high aspect ratio structures.

10. The method of claim 1, wherein annealing said substrate at a predetermined elevated temperature range for a predetermined period of time comprises rapid thermal annealing.

11. The method of claim 10, wherein annealing comprises exposing said substrate to a temperature profile in the range of about 200-500° C. for about 30 seconds.

12. The method of claim 1 wherein depositing said metal layer comprises depositing said layer in a thickness range of about 2-30 nm.

13. The method of claim 1 wherein depositing said metal layer comprises depositing said layer to a thickness of about 10 nm.

14. The method of claim 1 wherein depositing said metal layer comprises depositing metal by at least one of physical vapor deposition (PVD), chemical vapor deposition (CVD), and plasma enhanced chemical vapor deposition (PECVD).

15. The method of claim 1 wherein depositing said metal layer comprises depositing one or more alloys of Nickel, Erbium, Cobalt, Titanium, Platinum, and Ytterbium.

16. The method of claim 1 wherein said forming an amorphous alloy layer comprises forming an intermixed metal/silicon layer in the range of about 1-5 nm.

17. The method of claim 1 wherein migrating at least a portion of said alloy layer comprises migrating said amorphous alloy layer into said silicon substrate to form a textured intermixed layer on said substrate surface.

18. The method of claim 17 wherein said textured intermixed layer exhibits a substantially uniform thickness in the range of about 2-10 nm.

19. A method for fabricating an IC device on a silicon substrate having wide and narrow contact trenches, the method comprising:

depositing a layer of metal atoms at a thickness of about 2-30 nm on said substrate by a physical vapor deposition process;

forming an amorphous alloy layer at the interface of said metal layer and said silicon substrate in a thickness range of about one to five nanometers;

etching said substrate to remove unreacted metal from said substrate surface prior to annealing;

annealing said substrate by rapid thermal annealing at a temperature profile in the range of about 200-500° C. for about 30 seconds; and transferring said amorphous layer into said substrate surface to a thickness range of about 2-10 nanometers to thereby yield a textured metal silicide layer of uniform thickness at the bottoms of said wide and said narrow contact trenches.

* * * * *